US010196263B2

(12) United States Patent
Azhdast

(10) Patent No.: US 10,196,263 B2
(45) Date of Patent: Feb. 5, 2019

(54) ARRANGEMENT FOR APPLYING CONDUCTIVE NANOPARTICLES ONTO A SUBSTRATE

(71) Applicant: PAC TECH—PACKING TECHNOLOGIES GMBH, Nauen (DE)

(72) Inventor: Mohammad Hossein Azhdast, Berlin (DE)

(73) Assignee: PAC TECH—PACKING TECHNOLOGIES GMBH, Nauen (DE)

( * ) Notice: Subject to any disclaimer, the term of this patent is extended or adjusted under 35 U.S.C. 154(b) by 0 days.

(21) Appl. No.: 15/116,815

(22) PCT Filed: Jan. 28, 2015

(86) PCT No.: PCT/EP2015/051701
§ 371 (c)(1),
(2) Date: Aug. 4, 2016

(87) PCT Pub. No.: WO2015/117872
PCT Pub. Date: Aug. 13, 2015

(65) Prior Publication Data
US 2016/0346842 A1 Dec. 1, 2016

(30) Foreign Application Priority Data
Feb. 10, 2014 (DE) .......................... 10 2014 101 588

(51) Int. Cl.
B82Y 30/00 (2011.01)
B82Y 40/00 (2011.01)
(Continued)

(52) U.S. Cl.
CPC .............. B82Y 30/00 (2013.01); B22F 3/003 (2013.01); B22F 7/04 (2013.01); B82Y 40/00 (2013.01);
(Continued)

(58) Field of Classification Search
CPC ......... C23C 26/00; C23C 26/02; C23C 14/28; C23C 14/048; B05D 1/34; B05C 5/00;
(Continued)

(56) References Cited

U.S. PATENT DOCUMENTS 7,306,823 B2 * 12/2007 Sager .................... B22F 1/0018
257/E31.007
8,025,542 B2 * 9/2011 Birrell .................. B23K 26/046
445/24
2006/0062930 A1 * 3/2006 Kumar ..................... H05H 1/24
427/569

FOREIGN PATENT DOCUMENTS

DE 2007 005817 A1 8/2008
DE 10 2010 055 404 A1 8/2011
(Continued)

OTHER PUBLICATIONS

I. G. Loscertales et al, Micro/Nano Encapsulation via Electrified Coaxial Liquid Jets, Science Magazine, vol. 295, Mar. 1, 2002, pp. 1695-1698.*

Primary Examiner — Laura Edwards
(74) Attorney, Agent, or Firm — Lazaris IP

(57) ABSTRACT

An arrangement for applying metal nanoparticles onto a wafer or another substrate, is characterized by a metal or semiconductor part arranged in a liquid reservoir, laser or particle emitter for removing nanoparticles from the metal or semiconductor part in the liquid inside the liquid reservoir, and means for applying the removed metal particle containing liquid onto the substrate.

6 Claims, 2 Drawing Sheets

(51) Int. Cl.
- *C23C 14/28* (2006.01)
- *C23C 14/04* (2006.01)
- *C23C 26/00* (2006.01)
- *B22F 3/00* (2006.01)
- *B22F 7/04* (2006.01)

(52) U.S. Cl.
CPC ............ *C23C 14/048* (2013.01); *C23C 14/28* (2013.01); *C23C 26/00* (2013.01); *B22F 2007/042* (2013.01); *B22F 2301/052* (2013.01); *B22F 2301/10* (2013.01); *B22F 2301/15* (2013.01); *B22F 2301/255* (2013.01); *B22F 2301/30* (2013.01); *B22F 2302/45* (2013.01); *B22F 2304/05* (2013.01); *B22F 2999/00* (2013.01)

(58) Field of Classification Search
CPC ......... B05C 5/001; B05C 5/02; B05C 5/0208; B82Y 40/00; B82Y 30/00; B22F 9/04; B22F 7/04; B22F 3/003; B22F 2301/052; B22F 2301/30; B22F 2301/15; B22F 2302/45; B22F 2301/255; B22F 2304/05; B22F 2301/10; B22F 2007/042; B22F 2999/00; B22F 1/0018; B22F 2202/11; B05B 5/00; B05B 7/00
USPC ..................................................... 219/121.6
See application file for complete search history.

(56) References Cited

FOREIGN PATENT DOCUMENTS

| | | |
|---|---|---|
| DE | 10 2010 018 073 A1 | 10/2011 |
| JP | 2006 122845 A | 5/2006 |

* cited by examiner

ARRANGEMENT FOR APPLYING CONDUCTIVE NANOPARTICLES ONTO A SUBSTRATE

CROSS REFERENCE TO RELATED PATENT APPLICATIONS

This patent application is filed herewith for the U.S. National Stage under 35 U.S.C. § 371 and claims priority to PCT application PCT/EP2015/051701, with an international filing date of Jan. 28, 2015, which claims priority to German patent application No. 102014101588.6, filed Feb. 10, 2014. The contents of each of these applications are incorporated in their entirety herein.

STATEMENT REGARDING FEDERALLY-SPONSORED RESEARCH OR DEVELOPMENT

Not applicable.

TECHNICAL FIELD

The invention relates to an assembly for placing nanoparticles of metal or semiconductor material on a wafer or any other substrate.

BACKGROUND OF THE INVENTION

In photolithography, metallic nanoparticles are placed on a substrate to form seeds. Metallic conductor paths can grow at such seeds if further metallic material is added. There are various methods for placing metallic nanoparticles. A common method is vapor deposition.

Typically, metals having special properties are used. Such metals are, amongst others, gold, palladium, copper, aluminum, nickel, silver and tin. The metals are expensive and more or less poisonous. Upon vapor deposition of such metals there is a risk of loss of material. Also, there is a risk that the metals are breathed in or contacted to the skin of persons which get into contact with the metals. Consequently, there is a risk to human health.

From DE 10 2010 018 073 A1, DE 10 2010 055 404 A1, and JP 2006 612 2845, laser ablation in liquids is known.

BRIEF SUMMARY OF THE INVENTION

It is an object of the invention to provide an assembly for placing nanoparticles of metal on a wafer or any other substrate of the above-mentioned kind, where practically no metallic material is lost and the health risk is reduced.

According to the present invention, this object is achieved by:
(a) a metal- or semiconductor piece present in a liquid reservoir;
(b) a laser for removing nanoparticles from the metal- or semiconductor piece inside the liquid in the liquid reservoir; and
(c) means for placing the liquid comprising the metal particles on the substrate.

With such an assembly the nanoparticles of a metal- or semiconductor piece inside the liquid are removed by a laser or particle emitter. Consequently, they cannot freely fly around and be lost. There are no poisonous metal vapors. The material consumption is low. The nanoparticles remain in the liquid and are deposited together with the liquid on the substrate.

According to a preferred modification of the invention the liquid is a curable polymer or any other curable plastic material. An example of a suitable polymer is an epoxide compound or benzocyclobutene. Such materials are photosensitive materials for the use in photolithography. They can easily be removed by etching. Positive illumination is possible as well as negative exposure. The polymer not only ensures that the metal particles will not bounce off the substrate surface upon placement but ensure a good adhesion for subsequently added components.

Preferably, the metal is gold, silver, copper, palladium, aluminum, nickel, tin, an alloy of such metals, or a silicon based semiconductor. Such metals are good conductors and are, therefore, particularly suitable for the use in manufacturing semiconductor products, such as wafers or other substrates. It is understood, however, that other metals may also be used if this is required by the particular application.

Preferably, the assembly is provided with flow generating means for generating a liquid flow in the range where the nanoparticles are removed from the metal- or semiconductor pieces. The flow generating means may be a pump. The flow generating means may, however, also comprise an ultrasound hammer pressing the liquid through a passage with a reduced diameter. The flow generating means ensures that the nanoparticle content in the liquid is evenly distributed with the same laser beam.

In a further modification of the present invention, a jet is provided for placing the liquid comprising the nanoparticles on the substrate. The jet may be used to apply the liquid evenly thin and well-aimed on the substrate.

In a particularly preferred embodiment of the invention, the metal- or semiconductor pieces are positioned in the range before the jet. The nanoparticles are, therefore, directly flowed through the jet after removing them from the metal- or semiconductor piece and deposited on the substrate. They cannot settle or accumulate inside the assembly.

In a further modification of the invention the jet is an integrated part of a closed reservoir, wherein the reservoir is provided with a liquid inlet where pressurized liquid enters into the reservoir. The reservoir may be closed by a glass plate or another transparent cover on the side of the laser. The laser light enters the reservoir through the cover. Since the liquid is only very little compressible, each pressure exerted on the liquid will cause liquid to exit through the jet.

Further modifications of the present invention are subject matter of the sub-claims. Embodiments are described below in greater detail with reference to the accompanying drawings.

DETAILED DESCRIPTION OF THE INVENTION

Figure 1:
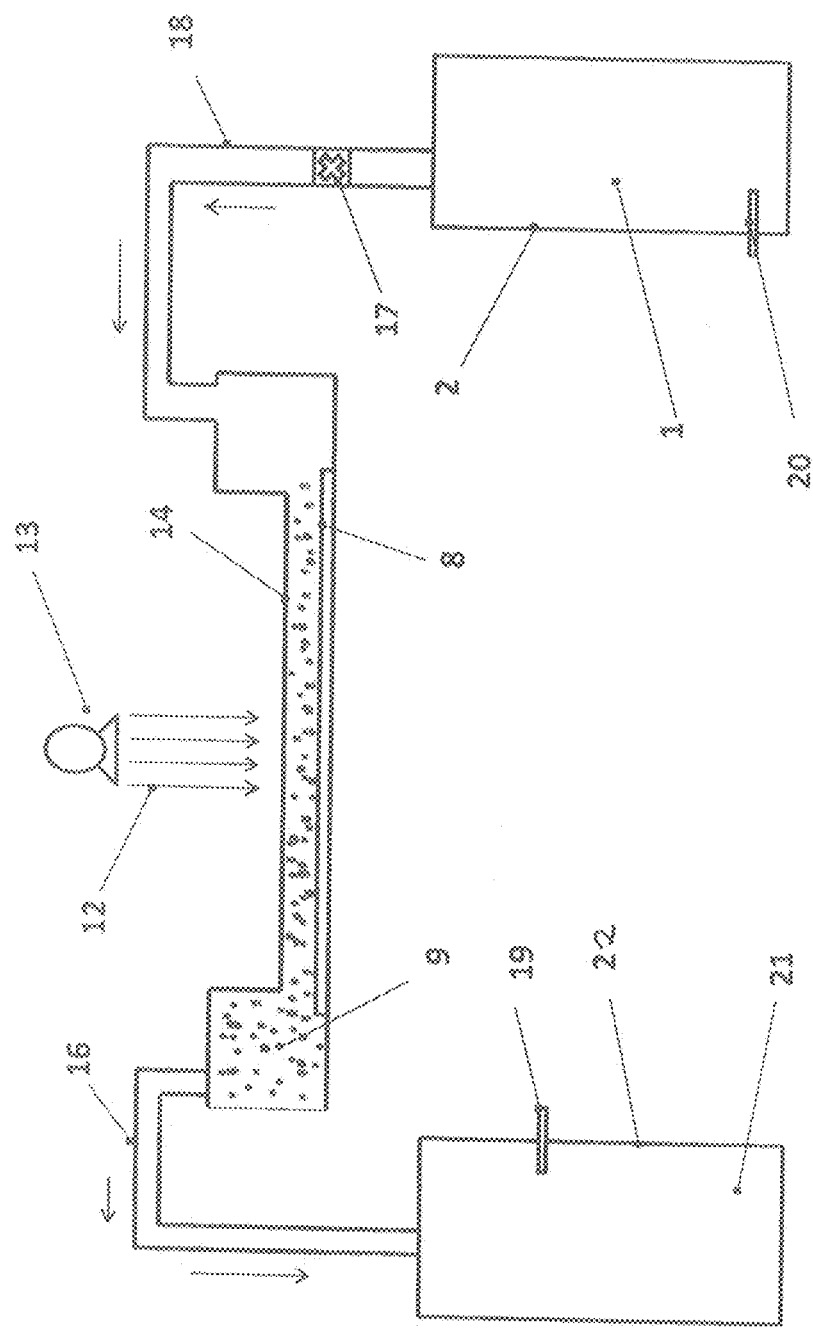
FIG. 1 is a schematic view of a first embodiment.

FIG. 1 is a schematic view of an assembly for the generation of metallic nanoparticles. The assembly is provided with a reservoir 2 with a liquid polymer, such as, for example an epoxide compound, designated with numeral 1. A sensor provided at the reservoir 2 for detecting the polymer density is designated with numeral 20. The polymer mass is moved by a pump 17 in the direction of the arrows through a pipeline 18. The pipeline 18 extends to a chamber 14. A metal- or semiconductor piece 8 is placed at the bottom of the chamber 14. Depending on the application the metal- or semiconductor piece 8 consists of gold (Au), silver (Ag), copper (Cu), palladium (Pd), aluminum (Al), nickel (Ni), tin (Sn) or an alloy of such metals. Furthermore, it is possible to use a silicon-based semiconductor material. The surface of the metal- or semiconductor piece 8 is surrounded by the polymer. The upper side of the chamber 14 is closed by a glass plate. A laser with a scanning system 13 is arranged above the chamber 14. The laser beam 12 is directed through the glass plate of the chamber 14 onto the metal- or semiconductor piece 8. Metal particles (nanoparticles) are ablated from the surface of the metal- or semiconductor piece 8. The nanoparticles ablated by such ablation process are accommodated by the polymer liquid.

The chamber 14 has a reduced thickness in the range of the laser beam 12. Thereby, it is achieved on one hand, that the laser beam 12 is absorbed by the polymer only by a little. On the other hand an increased flow velocity is achieved. Ablated metal particles may, therefore, not settle or accumulate.

The polymer liquid accommodating the ablated particles is flowed through an outlet pipe 16 to a second reservoir 22 by the pump. The polymer with the nanoparticles 21 is collected in the second reservoir and is available there for further use. A sensor 19 in the reservoir 22 detects the density of the nanoparticles in the reservoir.

The polymer liquid with the nanoparticles from the reservoir 22 may, for example, be used for re-wiring of wafer- and substrate surfaces. In this embodiment the polymer liquid with the nanoparticles may, for example, be applied to the substrate by spin coating. The material may be structured photolithographically with a mask afterwards. Cured polymer in the gaps in the structure may be removed in the usual way by edging or washing. In such a way very fine structures are achieved.

Figure 2:
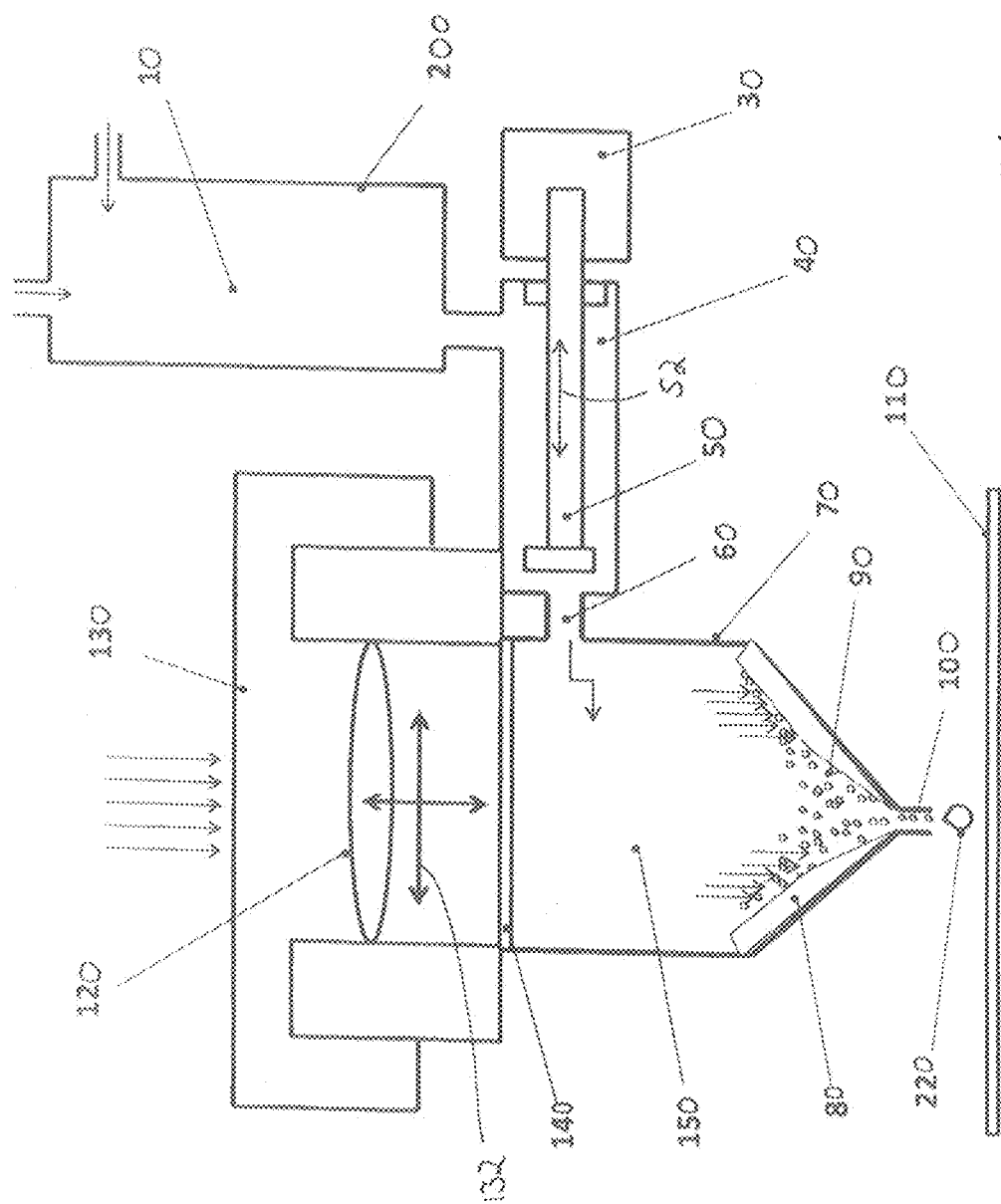
FIG. 2 is a schematic view of a second embodiment.

FIG. 2 shows an assembly, where the polymer liquid is directly applied to a substrate. Polymer liquid 10 is present in a reservoir 200. An outlet is provided at the lower end of the reservoir 200. The outlet extends into an elongated chamber 40. A hammer 50 sits in the chamber 40. The hammer 50 is moved back and forth in the direction of arrow 52 by means of an ultrasound generator 30. The chamber 40 is connected to a chamber 150 by a narrow channel 60. The chamber 150 conically narrows towards the lower end. A capillary or a jet 100 is integrated thereto. A substrate 110 is positioned below the jet 100. The substrate 110 or the jet 100 or both are adapted to be moved whereby material exiting the jet will be applied to the substrate at the desired spot.

Metal- or semiconductor pieces 80 are arranged in the conical lower range of the chamber 150. The chamber 150 is closed by a glass plate 140 at the upper end. Laser light may be moved with a quick scanner, based, for example, on an acousto-optic modulator 130 and through a lens 120 in the direction of the arrows 132 in an x- and y-direction. The laser light passes through the glass plate 140 and the polymer 150 towards the metal- or semiconductor pieces 80. There, the nanoparticles 90 are ablated by means of laser ablation. The ablated nanoparticles 90 are accommodated by the polymer. If the hammer 50 moves towards the left in the drawing fresh polymer without any nanoparticles is pressed through the channel 60. Thereby, a pressure is generated in the chamber 150. Polymer liquid with nanoparticles 90 is ejected towards the outside through the jet 100 in the form of a drop 220 and applied to the substrate 110. The polymer applied to the substrate 110 finally cures. This embodiment has the advantage that conductive paths may be produced without a mask and photolithographic methods. The nanoparticles with the polymer are directly on the substrate.

The above-described assembly was described in great detail. It is understood, however, that this shall not be limiting the scope of the patent which is determined solely by the claims. Many alternatives and equivalent means are known to the person skilled in the art which may be used without deviating from the basic idea of the invention. In particular, the geometric set-up of the assembly, materials, diameters and amounts may vary without deviating from the basic idea of the invention.

What is claimed is:

1. An assembly for placing nanoparticles of metal or semiconductor material on a substrate, comprising:
   (a) a liquid reservoir, said liquid reservoir comprising a curable liquid in the form of a curable polymer or any other curable plastic material;
   (b) a chamber having a liquid inlet and a lower end with an integrated capillary or jet for placing said liquid on a substrate outside said chamber, said chamber being in fluid communication with said liquid reservoir and wherein said chamber conically narrows towards said capillary or jet, thereby forming a conically narrowing range of the chamber near the capillary or jet;
   (c) a metal- or semiconductor piece provided in said liquid in said conically narrowing range of said chamber before the jet;
   (d) a laser beam directed through said chamber in the direction of said metal- or semiconductor piece for removing nanoparticles from said metal- or semiconductor piece into said liquid; and
   (e) means for entering pressurized liquid into a closed reservoir whereby a pressure is generated in said chamber and said pressure is adapted to eject said liquid with said nanoparticles towards the outside through said jet.

2. The assembly of claim 1, and wherein said metal- or semiconductor piece is made of gold, silver, copper, palladium, aluminum, nickel, tin, an alloy of such metals, or a silicon-based semiconductor.

3. The assembly of claim 1, and further comprising flow generating means for generating a liquid flow in the range where said nanoparticles are removed from said metal- or semiconductor piece.

4. The assembly of claim 3, and wherein said flow generating means are a pump.

5. The assembly of claim 3, and wherein a passage is provided with a reduced diameter in said liquid reservoir and said flow generating means comprise an ultrasound hammer pressing said liquid through said passage.

6. The assembly of claim 1, and wherein said reservoir has a laser side facing said laser and said reservoir is closed by a glass plate or another transparent cover on said laser side.

* * * * *